(12) United States Patent
Belpanno et al.

(10) Patent No.: US 10,913,424 B2
(45) Date of Patent: Feb. 9, 2021

(54) PERFECTED SWITCH

(71) Applicant: CEV LAB S.R.L. CON UNICO SOCIO, Lainate (IT)

(72) Inventors: Emanuele Belpanno, Carpi (IT); Giuseppe Testa, Carpi (IT)

(73) Assignee: CEV LAB S.R.L. CON UNICO SOCIO, Lainate (IT)

( * ) Notice: Subject to any disclaimer, the term of this patent is extended or adjusted under 35 U.S.C. 154(b) by 0 days.

(21) Appl. No.: 16/408,762

(22) Filed: May 10, 2019

(65) Prior Publication Data

US 2019/0344752 A1 Nov. 14, 2019

(30) Foreign Application Priority Data

May 14, 2018 (IT) ........................ 102018000005348

(51) Int. Cl.
*B60R 25/04* (2013.01)
*H05K 5/02* (2006.01)

(52) U.S. Cl.
CPC ........... *B60R 25/04* (2013.01); *H05K 5/0217* (2013.01)

(58) Field of Classification Search
None
See application file for complete search history.

(56) References Cited

U.S. PATENT DOCUMENTS

| | | | |
|---|---|---|---|
| 5,632,168 | A | 5/1997 | Yano |
| 5,671,621 | A | 9/1997 | Watanuki et al. |
| 6,095,415 | A | 8/2000 | Shouji |
| 7,948,358 | B2 | 5/2011 | Hidaka et al. |
| 2006/0290468 | A1 | 12/2006 | Hidaka et al. |
| 2007/0222557 | A1* | 9/2007 | Yoshimura ............. B60R 25/04 340/5.72 |
| 2007/0284943 | A1 | 12/2007 | Meeks |

FOREIGN PATENT DOCUMENTS

| | | |
|---|---|---|
| DE | 19531178 | 2/1996 |
| DE | 102006022068 | 1/2007 |
| EP | 0685620 | 12/1995 |
| EP | 0967129 | 12/1999 |
| GB | 2305966 | 4/1997 |
| JP | H10244853 | 9/1998 |
| JP | 2004217146 | 8/2004 |

\* cited by examiner

*Primary Examiner* — Carlos Garcia
(74) *Attorney, Agent, or Firm* — Pearne & Gordon LLP

(57) ABSTRACT

Provided is a switch for motor vehicles including an outer containing and protecting body which houses a lock cylinder. The lock cylinder is adapted to receive an ignition key and is rotatable through several operative positions by means of the rotation of said key. An antenna is connectable to an electronic immobiliser that is adapted to transmit to a control unit of a motor vehicle the motor vehicle engine ignition enable/disable signals. The antenna is located at said outer body.

12 Claims, 4 Drawing Sheets

PERFECTED SWITCH

FIELD OF THE INVENTION

The present invention relates to a perfected ignition switch, especially adapted for use on motor vehicles or the like.

BACKGROUND

Ignition and shut-off switches C are known, such as the one shown in FIGS. 1 and 2, mounted on motor vehicles, e.g. motorcycles, predisposed to start the engine.

As is known, such switches comprise a rotatable inner cylinder I inserted in an outer protecting body E, which has a passage for accessing the lock of the cylinder.

The cylinder has a plurality of positions, e.g. an ignition one, a shut-off one, a parking one and a locking one.

When the right key is inserted into the cylinder I and the user wishes to pass from the locking position to the shut-off one or vice versa, it is necessary to first exert a thrust on the cylinder so that the cylinder itself can be rotated, thus switching the status of the switch.

In fact, the cylinder I can be axially withdrawn following the user's thrust, and the translation thereof is subject to the action of a contrast spring that allows the return thereof to the initial position.

Ignition systems have been known for many years which comprise an electronic immobilisation device (or immobiliser) connected to the ignition switch.

The system envisages the use of a transponder integrated into the key (or into a remote control typically hooked to the key) and a transceiver that is provided with an antenna A included in the switch C and, to be precise, arranged between the cylinder I and the outer body E.

To be precise, the antenna A is shaped like a ring and is mounted on an annular support G which is fitted onto a metal body M in which the cylinder I is retained with the possibility to rotate.

In order to prevent the operation of the antenna A being negatively influenced by the metal body M, the annular support G is mounted on the latter so that the end part in which the antenna A is provided projects with respect to the metal body itself.

This requires the outer protecting body E to be conformed so as to house the antenna A and at the same time cover all the internal components, only leaving the lock of the cylinder accessible.

For this reason, the outer body E of the switch C is currently provided with a front and central depression D which laterally defines an advanced and circular portion P of the body E itself that contains the antenna A.

A drawback of the prior art solution, reported by various users, is that it can happen that a small stone or wood chip enters the front depression D of the switch and that, when the cylinder is pushed to switch the switch from the locked position to the shut-off position, or vice versa, the foreign object is inserted between the cylinder I itself and the outer body E, in fact preventing the cylinder I from performing a complete axial return stroke and therefore also preventing the switching.

Although such a circumstance occurs quite rarely, as the consequence is the fact that the vehicle cannot be switched on or however be used safely, there has been a strongly felt need for some time on the market to find new solutions that can overcome this limit.

BRIEF SUMMARY

The technical task underlying the present invention is therefore to offer a switch that satisfies this requirement.

This technical task is attained by the switch realised according to claim 1.

BRIEF DESCRIPTION OF THE DRAWINGS

Further characteristics and advantages of the present invention will become more apparent from the following indicative, and hence non-limiting, description of preferred, but not exclusive, embodiments of the switch of the invention, as illustrated in the accompanying drawings, in which.

DETAILED DESCRIPTION

Figure 1:
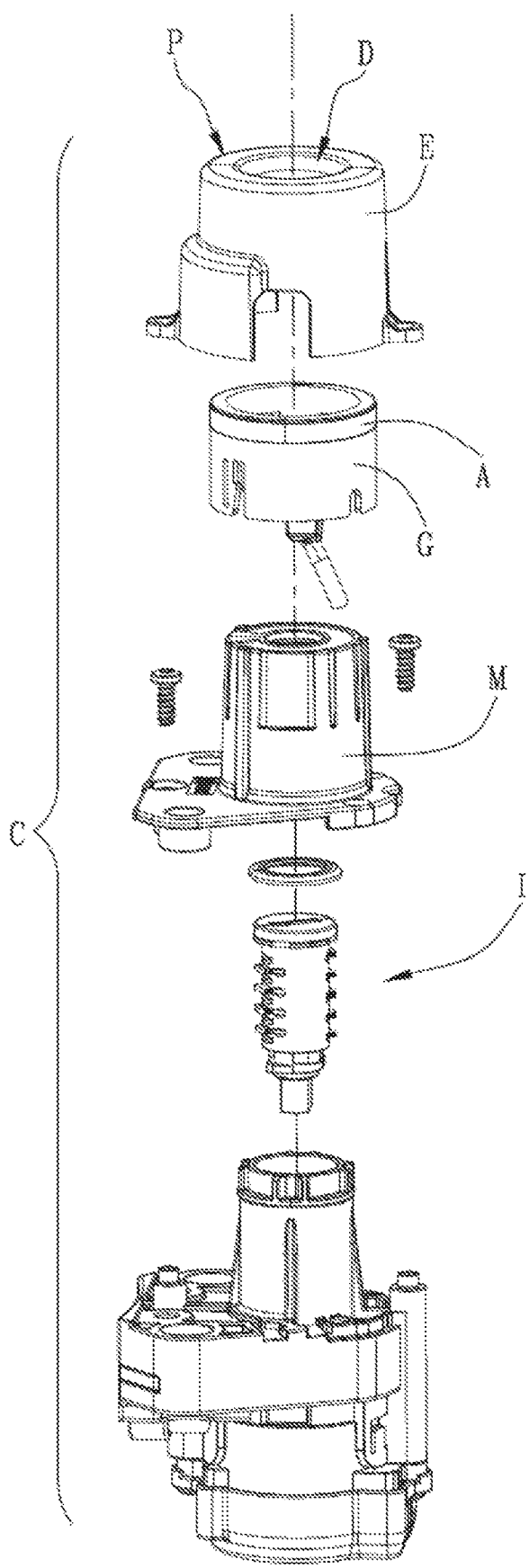
FIG. 1 is an exploded view of a switch of the prior art.
Figure 2:
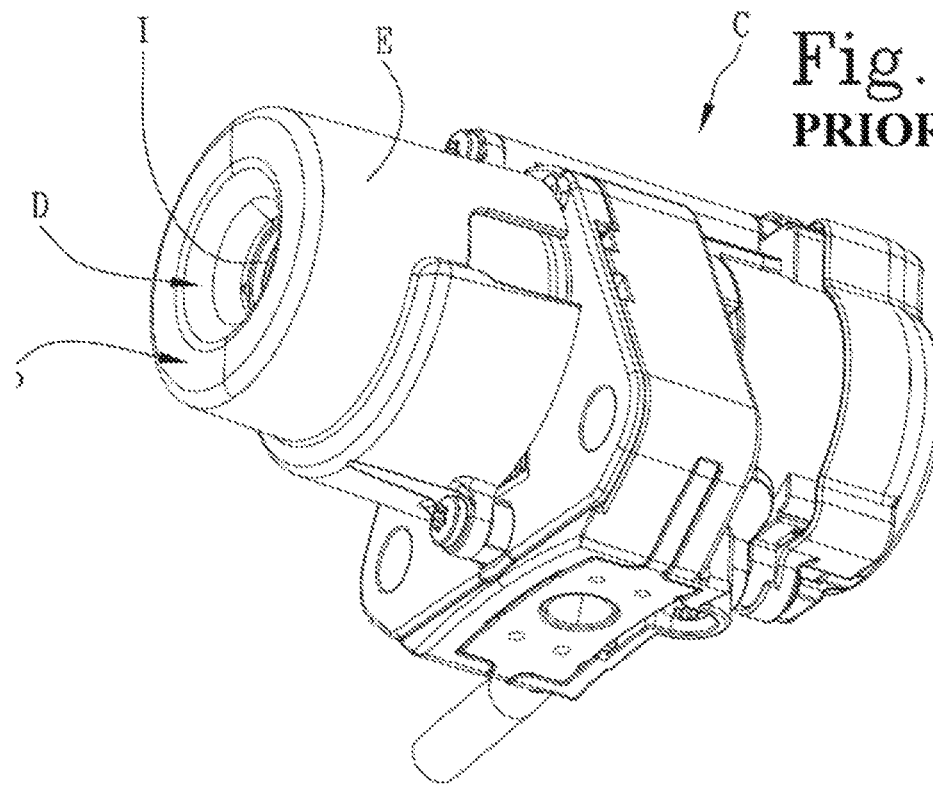
FIG. 2 is an axonometric view of the switch of FIG. 1.
Figure 3:
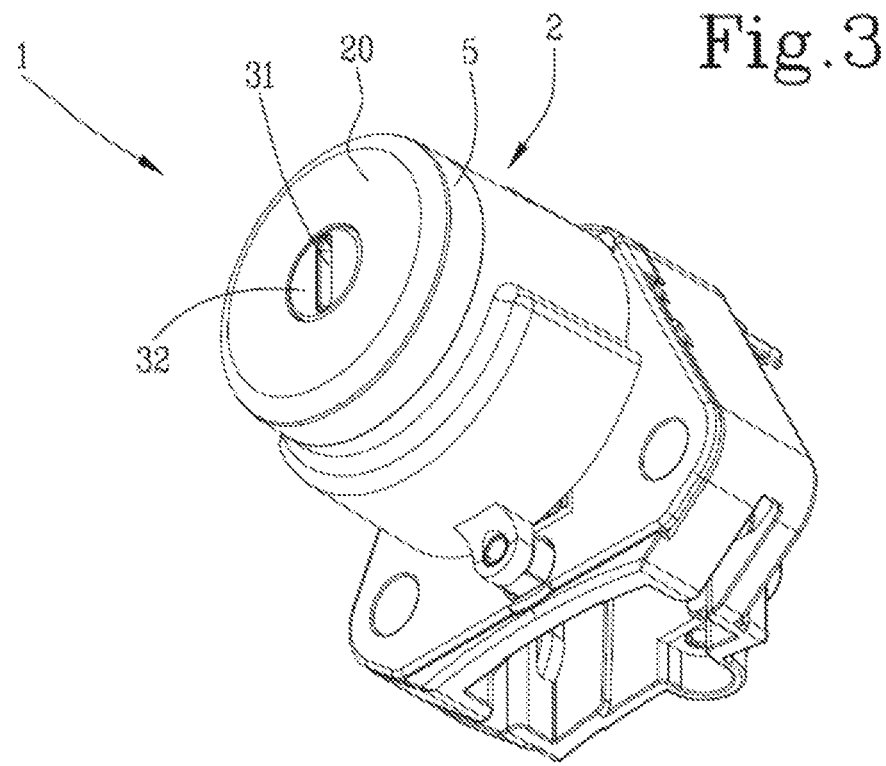
FIG. 3 is an axonometric view of the switch of the invention.

With reference to the above-mentioned figures, reference numeral 1 indicates a switch according to the invention.

The switch 1 proposed is especially, but not exclusively, intended to be mounted on a motor vehicle such as, for example, a motorcycle.

The switch 1 comprises an outer containing and protecting body 2 that houses a rotatable lock cylinder 3, adapted to receive the ignition key and rotatable at least between a shut-off position and an ignition position and preferably also in further operative positions, in particular a parking position and a locking position.

The outer body 2 is substantially axisymmetric in shape, at least in a main portion thereof and is hollow, so as to house the cylinder 3 and other mechanical components for switching.

The outer body 2 comprises a front portion including a flat annular wall 20, which is substantially transversal with respect to the main extension axis of the body itself, in which a hole 21 is centrally obtained which allows the access of the key to the cylinder 3, i.e. more precisely to the insertion hole 31.

The cylinder 3 in practice defines an ignition "lock" such as those of the prior art, allowing the switching between ignition, shut-off and other operative positions, obtained through the insertion of the key, the thrust and the rotation of the cylinder 3.

In other words, also the cylinder 3 according to the invention can be axially withdrawn following the user's thrust, and the translation thereof is subject to the action of an elastic contrast means such as, for example, a spring, which brings the cylinder 3 into the initial position.

Figure 4:
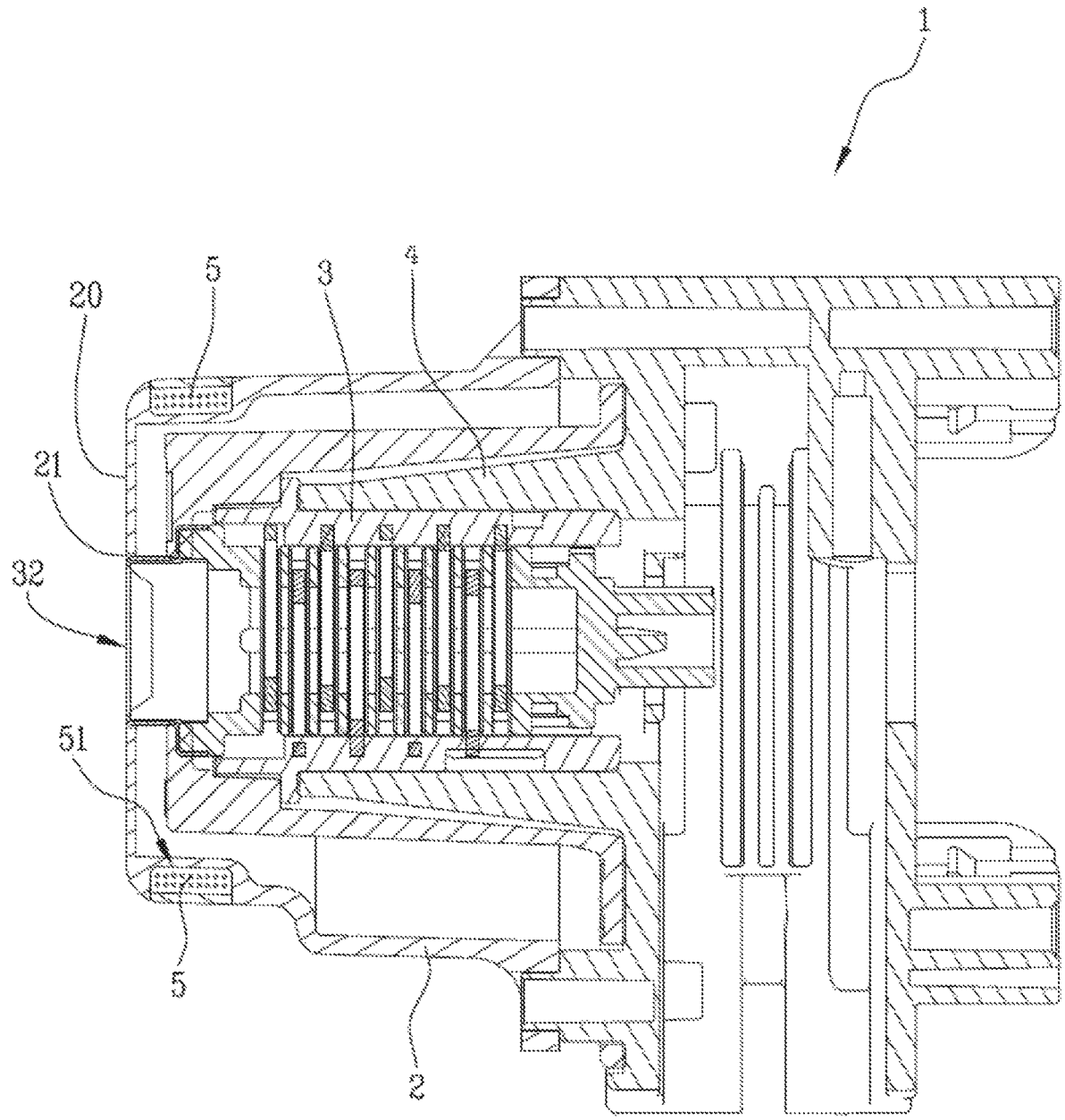
FIG. 4 is a longitudinal sectional view of the switch of FIG. 3.
Figure 5:
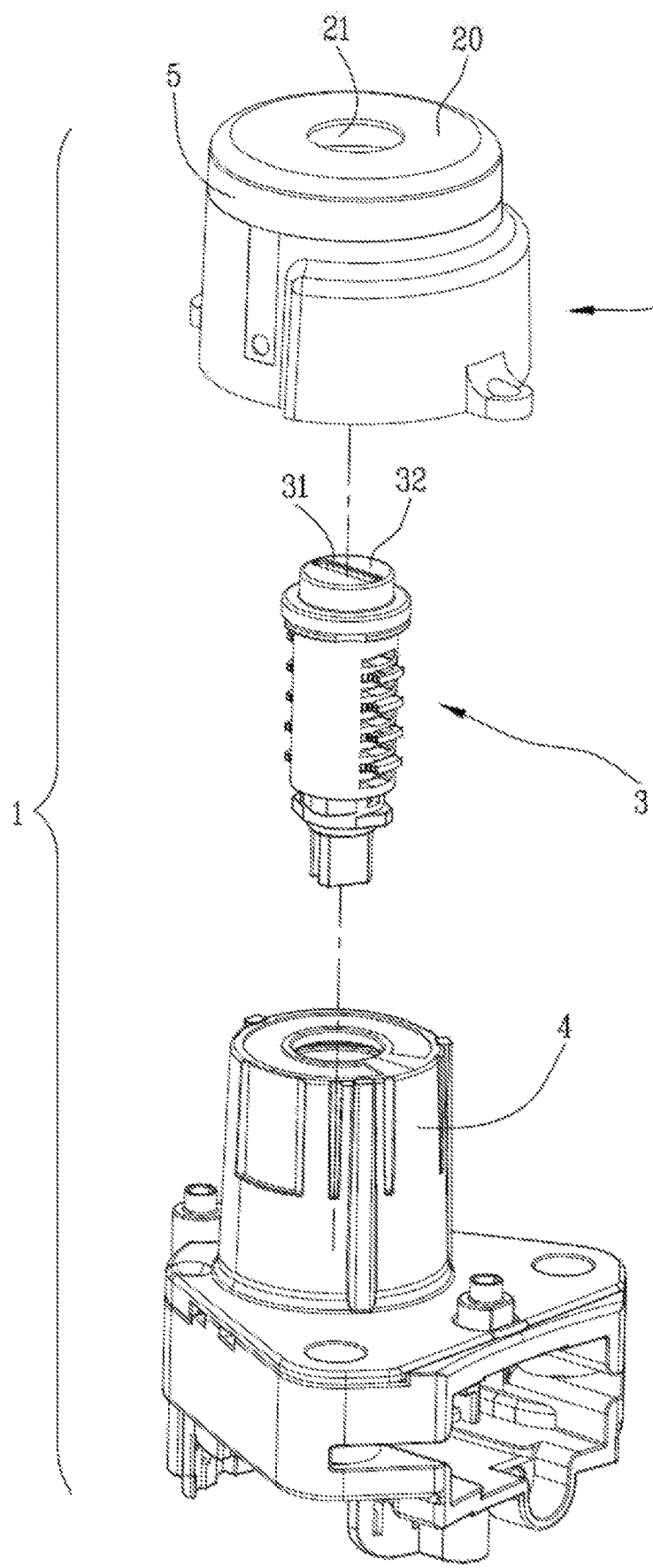
FIG. 5 is an exploded view of the switch of FIG. 3.

In detail, the cylinder 3 is inserted with the possibility to rotate with respect to a central longitudinal axis and to translate with respect to the same axis, in a cylindrical seat obtained in an inner retaining body 4 (shown in FIGS. 4 and 5), preferably made of metal material, also contained in the inner volume of the outer containing and protecting body 2.

The switch 1 further includes an antenna 5 connected to an electronic immobiliser, adapted to transmit to the control unit of the motor vehicle engine ignition enable/disable signals.

The antenna 5 is used for communication with a transceiver associated with the ignition key.

In particular, the transceiver may be a transponder (e.g. of the Rfid type) integrated into the key or into a remote control associated with the key.

According to an important aspect of the invention, the antenna 5 is located in the outer body 2.

The antenna 5 of the proposed switch is connected, e.g. through electrical cables, to a control logic unit of the electronic immobiliser (or ICU, Immobiliser Control Unit).

Such control unit 10 is configured to transmit to the control unit of the vehicle (or ECU, or Engine Control Unit) the vehicle engine ignition enable/disable signals.

Apart from the peculiar features of the switch disclosed in the present description, the electronic immobiliser can have the features and functions of known immobilisers.

Preferably, the antenna 5 is incorporated in the outer body 2 of the switch 1 and, even more preferably, it is co-moulded to the outer body 2.

For example, through co-moulding, or another manufacturing method, a seat 51 (indicated in FIG. 4) is defined on the outer surface of the outer containing and protecting body 2 in which the antenna 5 is located which is thus separated from the inner volume of the body 2 in which the cylinder 3 and the inner retaining body 4 of the cylinder 3 itself are located.

Already from this initial explanation, it can be understood that the antenna 5 is separated and distanced from the inner metal elements of the switch, especially from the inner body 4 in which the cylinder 3 is inserted and therefore does not undergo any interferences that could have a negative effect on its transmission properties.

This circumstance allows the switch 1 of the invention to be configured so as to eliminate the front recess or depression that was present in the prior art, bringing the front surface 32 of the cylinder 3, in which the inlet hole 31 for the key is obtained, flush with an outer surface of the front annular wall 20 of the outer body 2.

In this way, the switch 1 of the invention does not feature the recess present in the prior art which facilitated the entry of stones or chips that could get caught between the cylinder 3 and the body 2.

Therefore, the invention completely overcomes the limits of the prior art.

The antenna 5 preferably has an annular shape, at least in a main portion thereof; in this case, the antenna 5 can be arranged so as to at least partially surround a section of the outer body 2.

As can be seen in the appended figures, the antenna 5 is preferably arranged in a front end portion of the outer body 2, i.e. in proximity to or at the free end of the switch 1.

The invention claimed is:

1. A switch for motor vehicles, comprising an outer containing and protecting body housing a lock cylinder, adapted to receive an ignition key and rotatable through several operative positions by means of the rotation of said key; and at least one antenna connectable to an electronic immobiliser, adapted to transmit to a control unit of the motor vehicle the motor vehicle engine ignition enable/disable signals; said antenna being located at said outer body; wherein the antenna is located in a seat defined at an outermost surface of the switch.

2. The switch according to claim 1, wherein said antenna is incorporated in the outer body.

3. The switch according to claim 2, wherein the antenna is co-moulded to the outer body.

4. The switch according to claim 1, wherein the outer containing and protecting body includes therein a gap disposed radially between the antenna and the cylinder.

5. The switch according to claim 4, wherein the gap is an annular gap radially disposed between a radially outer volume of the body itself and a radially inner volume of the body itself, and wherein the seat is provided at the radially outer volume.

6. The switch according to claim 1, wherein the antenna includes at least one part of annular shape.

7. The switch according to claim 1, wherein the seat is defined on an outer surface of the outer body and is separated from the lock cylinder by an inner volume defined by the outer body itself.

8. The switch according to claim 1, wherein the seat is located at a front end portion of the outer body.

9. The switch according to claim 1, wherein the outer body comprises a front portion including an annular wall wherein a hole allowing the access of the key to said cylinder is obtained, the cylinder having a front surface wherein is obtained an opening for the insertion of the key which is substantially flush with a surface of said annular wall.

10. A motor vehicle comprising: an electronic immobiliser provided with a control logic unit configured to transmit to a control unit of the vehicle the vehicle engine ignition enable/disable signals; and a switch according to claim 1, wherein the antenna is connected to said immobiliser control logic unit.

11. The switch according to claim 1, wherein the antenna is an annular body of constant axial thickness along an insertion axis of the lock cylinder along which the ignition key is inserted.

12. The switch according to claim 1, wherein the antenna is an annular body of constant radial thickness about an insertion axis of the lock cylinder along which the ignition key is inserted.

* * * * *

UNITED STATES PATENT AND TRADEMARK OFFICE
CERTIFICATE OF CORRECTION

PATENT NO. : 10,913,424 B2  
APPLICATION NO. : 16/408762  
DATED : February 9, 2021  
INVENTOR(S) : Emanuele Belpanno et al.

Page 1 of 1

It is certified that error appears in the above-identified patent and that said Letters Patent is hereby corrected as shown below:

On the Title Page

In Item (71) Applicant and in Item (73) Assignee, delete "CEV LAB S.R.L. CON UNICO SOCIO" and insert therefor --CEV LAB S.R.L.--.

Signed and Sealed this  
Sixth Day of September, 2022

Katherine Kelly Vidal  
*Director of the United States Patent and Trademark Office*